(12) United States Patent
Panning

(10) Patent No.: US 7,154,101 B2
(45) Date of Patent: Dec. 26, 2006

(54) EUV ENERGY DETECTION

(75) Inventor: Eric Panning, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 150 days.

(21) Appl. No.: 10/403,961

(22) Filed: Mar. 31, 2003

(65) Prior Publication Data

US 2004/0188627 A1    Sep. 30, 2004

(51) Int. Cl.
    *G01J 1/42* (2006.01)
(52) U.S. Cl. .................... 250/372; 250/336.1
(58) Field of Classification Search ........... 250/372, 250/336.1
    See application file for complete search history.

(56) References Cited

U.S. PATENT DOCUMENTS 4,032,783 A * 6/1977 Koda ................... 250/333
4,691,104 A * 9/1987 Murata et al. ........ 250/338.3
6,377,655 B1 * 4/2002 Murakami et al. ....... 378/84
6,710,351 B1 * 3/2004 Berger .................. 250/372
2003/0231415 A1 * 12/2003 Puerto ................... 359/883

* cited by examiner

*Primary Examiner*—Otilia Gabor
*Assistant Examiner*—Christine Sung
(74) *Attorney, Agent, or Firm*—Blakely, Sokoloff, Taylor & Zafman LLP

(57) ABSTRACT

A detector for extreme ultraviolet (EUV) energy uses incidence reflectance of the EUV beam off the detector to both capture a small but controllable fraction of the EUV energy and to redirect most of the energy to its target. In one embodiment, a reflective coating of material on a sensor surface is used. In another embodiment, a multi-layer reflector on a sensor is used. A method of making the multi-layer reflector/sensor is also described.

13 Claims, 11 Drawing Sheets

REPEAT

EUV ENERGY DETECTION

BACKGROUND

1. Technical Field

An embodiment of the invention relates generally to the detection of electromagnetic energy, and in particular relates to a detector to detect extreme ultraviolet radiation.

2. Description of the Related Art

Photo-lithography processes are used to create the very small features that make up integrated circuits, by projecting high-density patterns of electromagnetic radiation onto a wafer during manufacture. Higher density integrated circuits require smaller feature sizes. However, a limiting factor in how small the features can be produced is the wavelength of the radiation used to project the pattern. Current photo-lithography techniques may use radiation in the vacuum ultraviolet (VUV) range, with a wavelength approximately in the 100–200 nanometer (nm) range, but significant increases in feature density may require the use of extreme ultraviolet (EUV) radiation, which may have a wavelength approximately in the 10–14 nm range. However, EUV radiation is highly absorbed by most materials, so EUV-based lithography may require different techniques than are used with longer wavelengths of radiation.

Controlling the amount of energy projected during the lithography operation is important, and requires determining the amount of energy in the EUV beam. Diode based sensors may be used to measure EUV intensity. Unfortunately, directing a controlled portion of the beam to a diode sensor with a beam splitter, which works well with longer wavelengths of radiation, is impractical with the high-energy EUV radiation. Conventional forms of detecting the electromagnetic energy off-axis in the lithography tool have proven to produce significant errors, since the actual dose within the path must be inferred, and controlling the percentage of energy off-axis is difficult.

BRIEF DESCRIPTION OF THE DRAWINGS

The invention may be understood by referring to the following description and accompanying drawings that are used to illustrate embodiments of the invention. In the drawings.

DETAILED DESCRIPTION OF THE INVENTION

Figure 1:
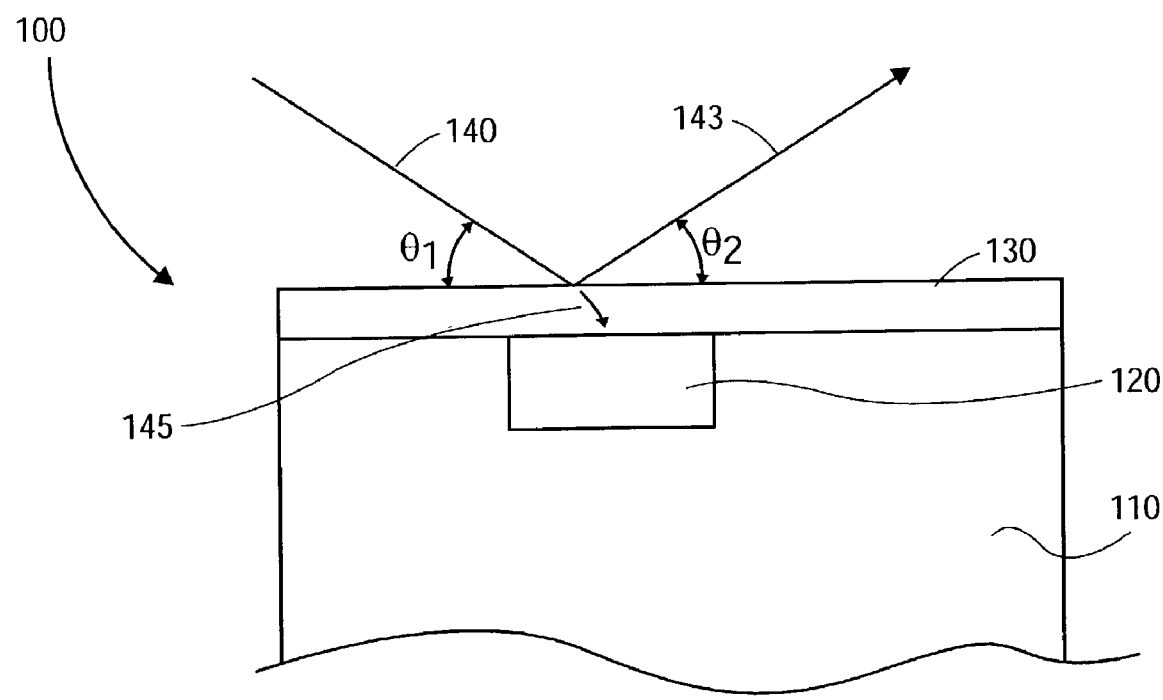
FIG. 1 shows a cross section of a grazing-incidence detector comprising a sensor coated with a reflective material, according to one embodiment of the invention.

In the following description, numerous specific details are set forth. However, it is understood that embodiments of the invention may be practiced without these specific details. In other instances, well-known structures and techniques have not been shown in detail in order not to obscure an understanding of this description.

References to "one embodiment", "an embodiment", "example embodiment", "various embodiments", etc., indicate that the embodiment(s) of the invention so described may include a particular feature, structure, or characteristic, but not every embodiment necessarily includes the particular feature, structure, or characteristic. Further, repeated use of the phrase "in one embodiment" does not necessarily refer to the same embodiment, although it may.

Some of the drawings show physical devices. The drawings are not drawn to scale, and the relative dimensions shown in the drawings should not be interpreted as a limitation on the relative dimensions of physical devices. Any references to "up", "down", "above", "below", or similar directional terms, refer to the orientation as shown in the drawings, and not necessarily to the orientation of an actual physical device with respect to gravity.

Various embodiments of the invention pertain to an EUV detector with a reflective structure disposed on a sensor. The reflective structure permits a small portion of incident EUV energy to be captured and detected by the sensor, while reflecting a substantial portion of the energy to the intended target. One embodiment uses for the reflective structure a layer of material that is reflective at the EUV wavelengths at a grazing incidence angle. Another embodiment uses a multi-layer reflector as the reflective structure.

Coated Detector

FIG. 1 shows a cross section of a detector comprising a sensor coated with a reflective material, according to one embodiment of the invention. The detector 100 may comprise a substrate 110, a sensor 120, and a reflective structure in the form of a reflective layer 130. In one embodiment reflective layer 130 comprises a material that reflects a substantial amount of EUV radiation striking the surface of reflective layer 130 at a shallow angle (e.g., an angle of incidence of less than 20 degrees), while absorbing a sufficient portion of the EUV radiation to be detectable by the sensor 120.

In one embodiment, sensor 120 may comprise a pyroelectric sensor that detects thermally induced distortion of a crystal lattice at or near the surface of the sensor 120, and is sensitive to rates of change in temperature. Commercially available pyroelectric sensors may be sensitive to wavelengths from infrared through x-ray, may be able to resolve pulses of less than 1 nanosecond (ns), and may have threshold sensitivities of approximately 0.2 micro joules. In a particular embodiment the sensor 120 is comprised of lithium tantalate and is 1–2 millimeters (mm) across, but other embodiments may use other materials and/or sizes.

The substrate 110 may comprise any suitable substance that provides physical support for the sensor 120 and the reflective layer 130, and may also provide electrical connections (not shown) to the sensor 120 so that the amount of energy detected by sensor 120 may be converted into usable electrical signals.

In one embodiment the reflective layer 130 has a thickness in the range of approximately 100–200 nanometers (nm), but other embodiments may have other thicknesses.

While in one embodiment reflective layer 130 comprises ruthenium, in an alternate embodiment reflective layer 130 may comprise other materials (e.g., gold).

In one embodiment substrate 110 and reflective layer 130 are circular with a diameter of approximately 3 inches, while sensor 120 is circular with a diameter of approximately 1–2 mm, but other embodiments may have other sizes and shapes. (Note: the figures show the various elements in cross section, so that the overall shape of those elements cannot be determined from the figures.)

FIG. 1 also shows a ray of EUV radiation 140 striking reflective layer 130 at an angle of incidence $\theta 1$, and reflecting off reflective layer 130 as ray 143 at an equal angle of reflection $\theta 2$, from where the ray 143 may travel to a target area, such as a focusing reflector. The focusing reflector may redirect the ray through a patterning mask to a wafer for lithographic patterning. A portion 145 of the ray may penetrate into the reflective layer 130, where it may be partially or fully absorbed to create the thermal effects that permit detection. In one embodiment, angle of incidence $\theta 1$ is a grazing angle of approximately 2 degrees, but other grazing angles may also be used.

Although a single ray 140 is shown striking the reflective layer 130 at a single point, this is a simplification that is intended to illustrate the effects of the reflective layer on incoming radiation. In actual usage, many parallel rays 140 may strike throughout a larger portion of the surface area of the reflective layer 130, including areas not over the sensor 120.

The surface roughness of the reflective layer 130 may have a significant effect on the amount of light reflected to the target area. Because surface roughness may cause any single point on the surface of reflective layer 130 to vary from the overall plane of that surface, the angle of incidence and angle of reflection may vary from $\theta 1$ and $\theta 2$ at that point, causing reflected ray 143 to be scattered and miss the target area.

Figure 2:
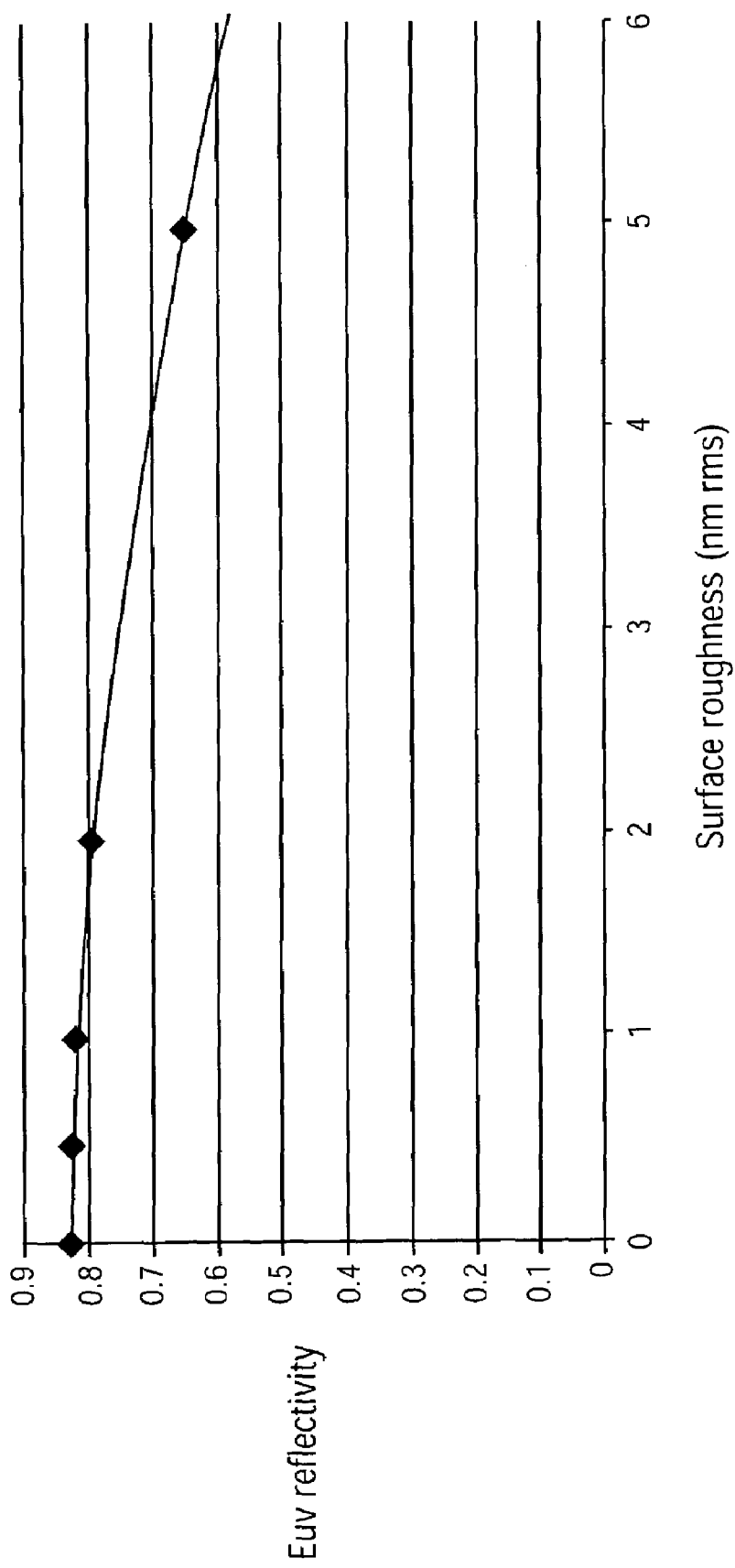
FIG. 2 shows a chart of the amount of reflectivity of a ruthenium layer based on surface roughness, according to one embodiment of the invention.

FIG. 2 shows a chart of the amount of reflectivity of a ruthenium layer based on surface roughness, according to one embodiment of the invention. The surface roughness may be measured in statistical units of vertical variation, e.g., in this case expressed in nanometers root-mean-squared (nm rms). Surface roughness of the untreated reflective layer 130 (as the layer exists after being deposited but before further treatment) may be improved through various means (e.g., chemical mechanical polishing, magneto-rheological polishing, ion milling, etc.) One embodiment has a surface roughness of between approximately 0.2 nm rms and approximately 2.0 nm rms, but other embodiments may have other values.

In the chart of FIG. 2, the EUV radiation has a wavelength of 13.5 mn, and the angle of incidence is approximately 15 degrees. Other values for these parameters may produce somewhat different reflectivity.

Incoming radiation that is not reflected or scattered may penetrate into the reflective layer 130, where it may be absorbed and converted into thermal energy that is conducted into sensor 120, where the energy is detected. In one embodiment, approximately 16 percent of the incident radiation penetrates into the reflective layer 130 in this manner, but other embodiments may have other percentages.

Figure 3:
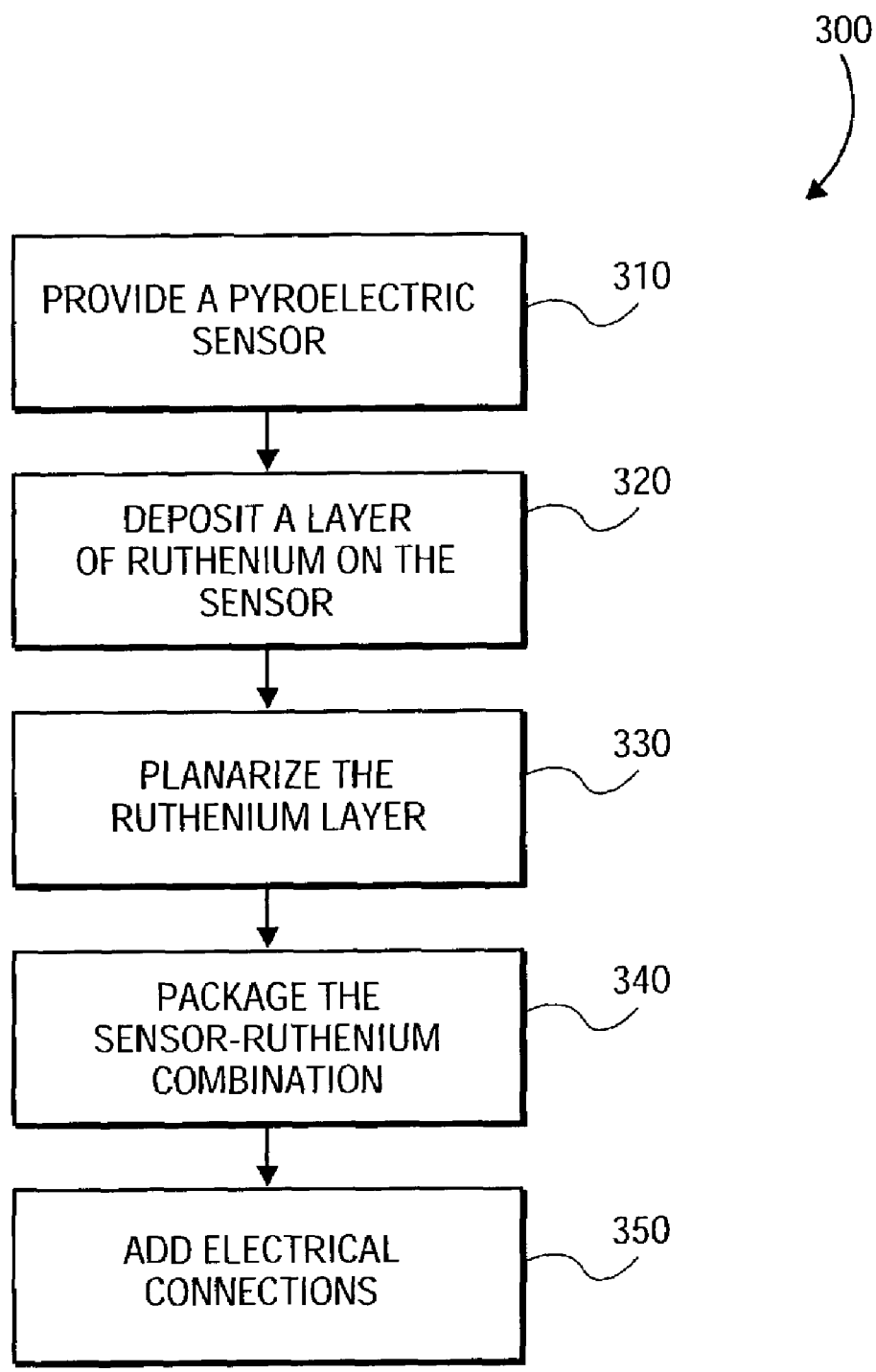
FIG. 3 shows a flow chart of a process for fabricating a detector, according to one embodiment of the invention.

FIG. 3 shows a flow chart of a process for fabricating a detector, according to one embodiment of the invention. In flow chart 300, at 310 a pyroelectric sensor is provided. At 320, a reflective layer is deposited on the sensor. In one embodiment, this deposition is accomplished through sputtering, but other embodiments may use other techniques, such as physical vapor deposition (PVD). In the illustrated example the reflective layer comprises ruthenium, but other embodiments may comprise other materials (e.g., gold, etc.)

At 330 the surface of the reflective layer is planarized to provide a flat reflective surface with very little surface roughness. In one embodiment, this may be accomplished through chemical mechanical polishing (CMP), but other embodiments may use other techniques (e.g., magneto-rheological polishing, ion milling, etc.). In one embodiment, the surface is planarized to a surface roughness of less than 1.0 nm rms, but other embodiments may have a surface roughness outside this range.

At 340 the combined sensor and reflective layer are packaged to provide a suitable structure for mounting and protecting them. At 350 electrical connections are made so that the sensor may be electrically coupled to suitable circuitry for converting the sensor output to usable electrical signals.

Multi-Layer Reflector and Sensor

Figure 4:
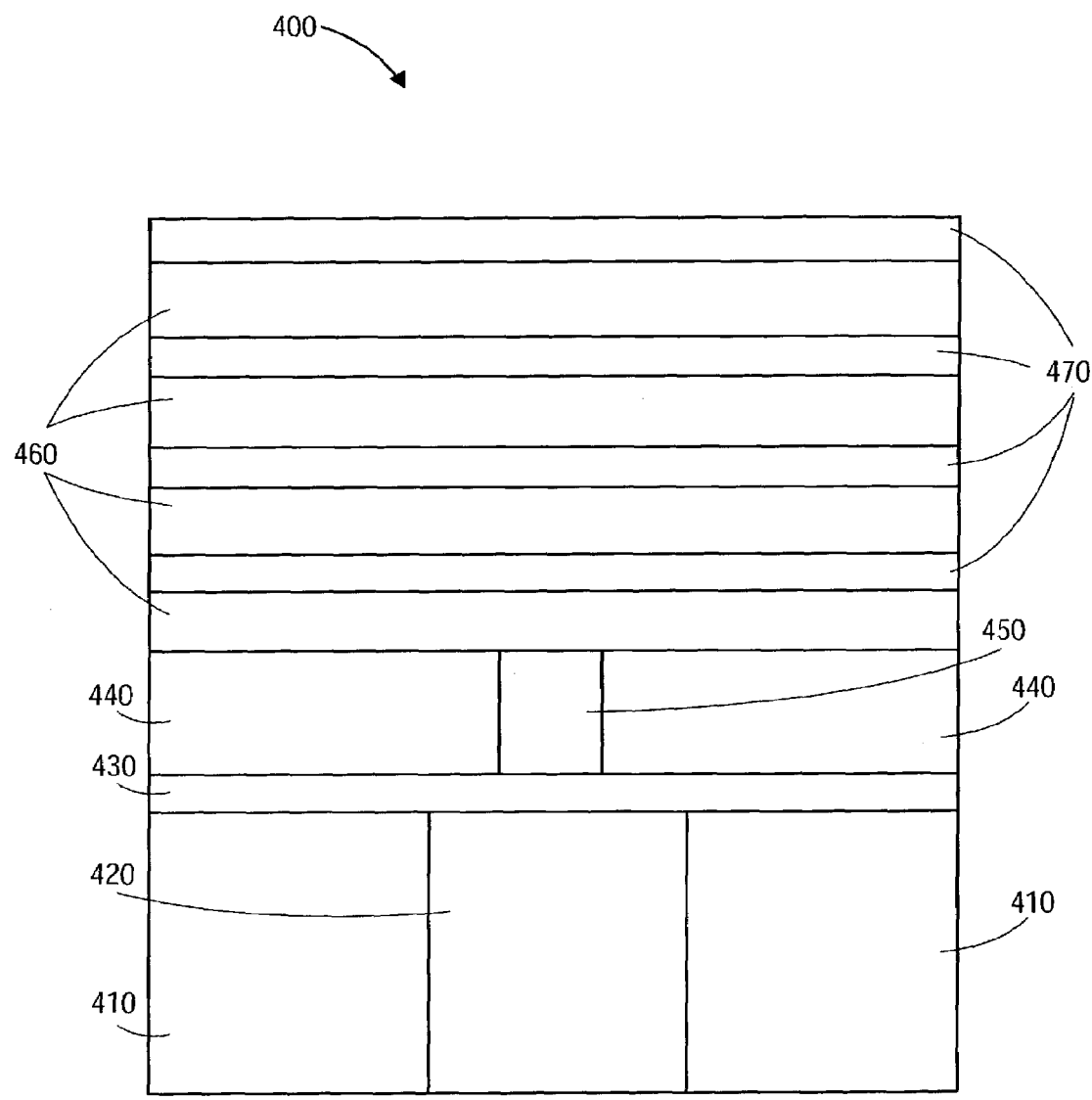
FIG. 4 shows a cross section of a detector comprising a multi-layer reflector, according to one embodiment of the invention.

FIG. 4 shows a cross section of a detector comprising with a multi-layer reflector, according to one embodiment of the invention. In the illustrated detector 400, substrate 410 provides a base for the remaining materials. Substrate 410 may also comprise other details not shown, such as electrical connections between the remaining layers and other circuitry. In one embodiment the substrate 410 comprises silicon, but other embodiments may use other materials such as ultra low expansion glass, etc. The illustrated embodiment shows a hole through substrate 410 in which sensor 420 is inserted, but other embodiments may use other techniques, for example, fabricating a sensor on and/or in the substrate.

Sensor 420 may comprise material that reacts to electromagnetic radiation in a way that permits the generation of an electrical signal representing the amount of electromagnetic radiation received. In one embodiment sensor 420 comprises a pyroelectric material (e.g., lithium tantalate, lithium niobate, strontium barium niobate, lead zirconate titanate, etc.), but other embodiments may use other types of sensors (e.g., a diode sensor, etc.)

Insulating layer 430 may comprise a material that is essentially electrically non-conductive to provide electrical insulation between the substrate 410 and control layer 440, and is also optically transmissive (at least at the EUV wavelengths) to convey EUV radiation to sensor 420 from above. In one embodiment, insulating layer 430 comprises silicon dioxide ($SiO_2$), but other embodiments may comprise other materials, such as silicon nitride ($Si_3N_4$), etc. In one embodiment insulating layer 430 has a thickness of between approximately 50 and approximately 100 nm, but other embodiments may use other thicknesses.

Control layer 440 may be used to controllably reduce the amount of EUV radiation that reaches the sensor 420, by restricting the area through which the EUV radiation may pass. In one embodiment, control layer 440 is comprised of chromium (Cr) to limit the radiation reaching the detector (at normal incidence, reflection would be minimal). In one embodiment, the control layer 440 has a thickness between approximately 190 and approximately 200 nm. Other embodiments may use other materials and/or other thicknesses.

Control layer 440 may contain a control hole 450 through which a predetermined percent of the electromagnetic radiation received from above may pass through to insulating layer 430. This technique may be used to keep the expected levels of EUV radiation received by the sensor 420 within the linear region of the sensor and above the noise threshold of the sensor. The insulating layer 430 may absorb some of the EUV radiation that passes through the control hole 450, which may be accounted for in determining the proper size of the control hole 450. In one embodiment, a single hole per sensor is used, but other embodiments may use multiple holes per sensor. In various embodiments, the control hole 450 may be cylindrically shaped with a diameter of between approximately 40 nm and approximately 1 mm, but other embodiments may have holes of other shapes and sizes.

In some embodiments, control hole 450 is filled with a filler material to filter out unwanted wavelengths of radiation. In a particular embodiment, the hole is filled with Zirconium (Zr) to filter out infrared, visible and ultra-violet radiation. After filling, the filler material may be planarized to create a smooth surface at the top of the control hole 450. In one embodiment the control layer 440 and filler material may be planarized in the same operation to present a uniform flat smooth surface for both the control layer material and filler material.

A multi-layer (ML) reflector may be disposed on the control layer. An ML reflector has alternating layers of two different materials with different refractive indices, so that the interface between any two adjacent layers will reflect a portion of incident radiation and allow another portion to pass through the interface. The layers may be spaced so that the reflected radiation from one interface will be substantially in-phase with reflected radiation from the adjacent interface. In the illustrated embodiment alternating layers of a first material 460 and a second material 470 are disposed directly above the control layer 440 to form an ML reflector. In one embodiment, the two materials are comprised of molybdenum (Mo) and silicon (Si), but other embodiments may use other combinations of materials, such as Mo and beryllium (Be).

In FIG. 4 the layers of first material 460 are shown with a different thickness than the layers of second material 470, but that is only for clarity of illustration. The thickness of each layer may be chosen so that electromagnetic radiation reflected from each layer will be in phase with electromagnetic radiation reflected from higher layers. Thus the thickness of each layer may be determined by the wavelength of electromagnetic radiation being used, the angle of incidence, and the refractive index of the materials being used. In one embodiment the thickness of each layer is between approximately 5 nm and approximately 10 nm, but other embodiments may use other thicknesses.

The number of bilayers (where a bilayer is a layer of the second material directly above and in contact with a layer of the first material) may be selected to achieve the desired percentage of electromagnetic radiation that is to be reflected and/or the percentage that is to reach the control layer. In one embodiment the number of bilayers is between approximately 30 and approximately 60, but other numbers of bilayers may also be used. In a particular embodiment the number of bilayers is approximately 40.

Figure 5:
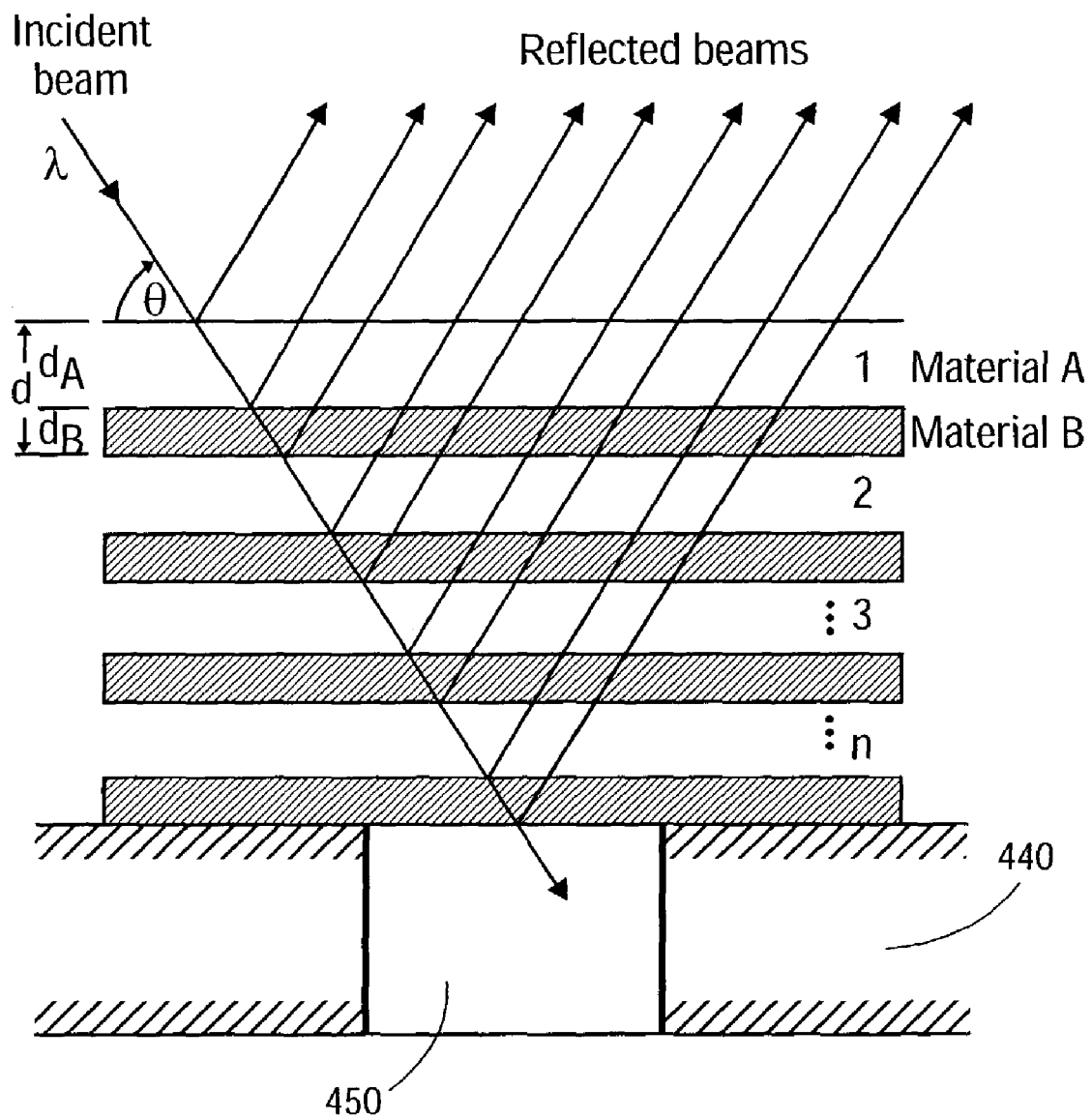
FIG. 5 shows a schematic of the effects of a multi-layer reflector, according to one embodiment of the invention.

FIG. 5 shows a schematic of the effects of a multi-layer reflector, according to one embodiment of the invention. In the illustrated example, each bilayer (numbered 1 through n, and with a thickness d) has a first material A (with a thickness $d_A$) and a second material B (with a thickness $d_B$). The illustrated embodiment has an equal number of layers of material A and material B, but other embodiments may not. The illustrated embodiment shows two different types of layers, but other embodiments may have three or more different types of layers.

Figure 6:
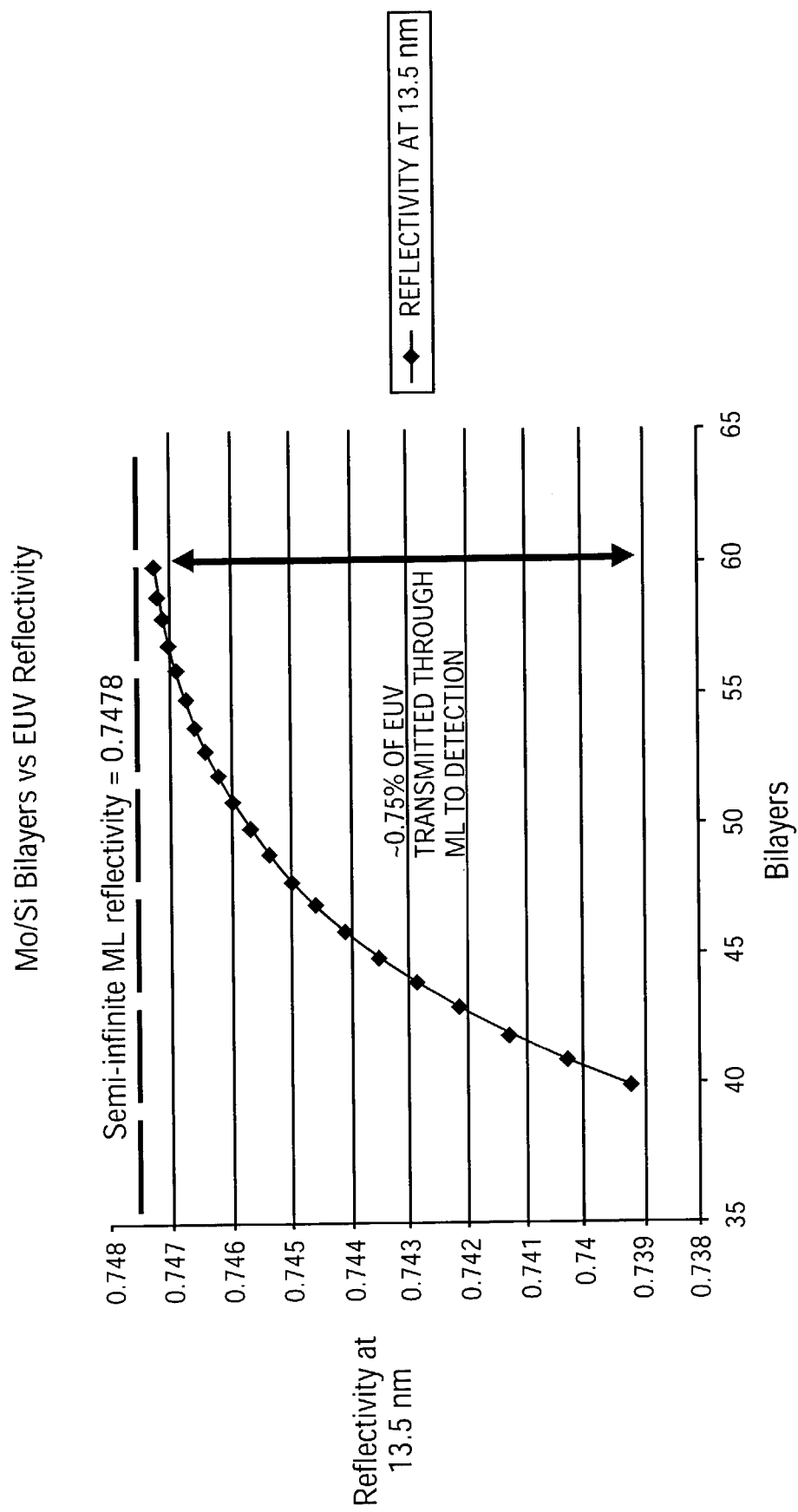
FIG. 6 shows an example graph of reflectivity vs. the number of bilayers, according to one embodiment of the invention.

FIG. 6 shows an example graph of reflectivity vs. the number of bilayers, according to one embodiment of the invention. The graph is for an embodiment using EUV with a wavelength of approximately 13.5 nm, with bilayers of Mo and Si. As can be seen, beyond a certain number of bilayers (in this example approximately 60), additional bilayers do not contribute significantly to reflectivity, but might reduce the amount of energy reaching the detector.

Figure 7:
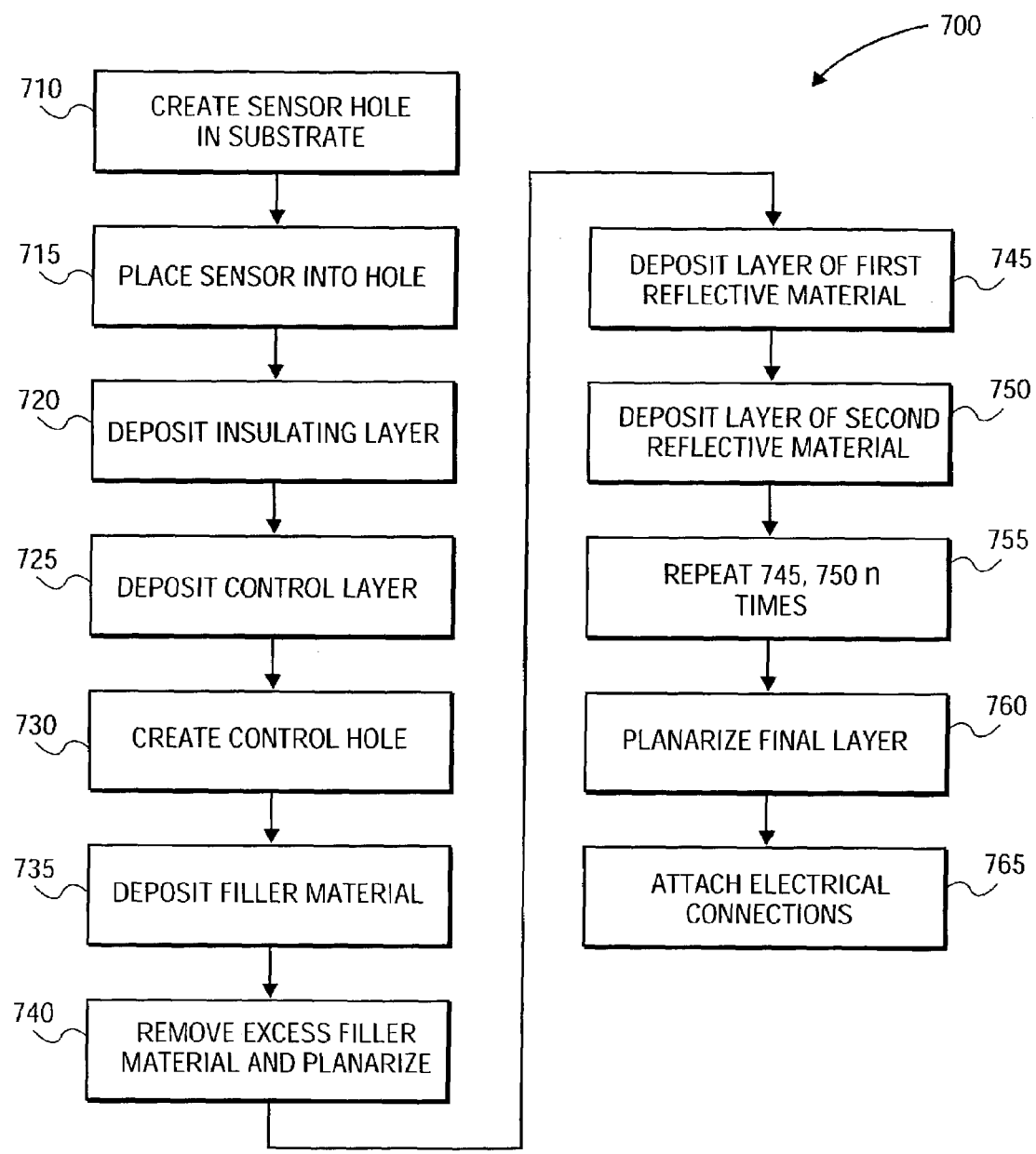
FIG. 7 shows a flow chart of a method of fabricating a detector, according to one embodiment of the invention.
Figure 8A:
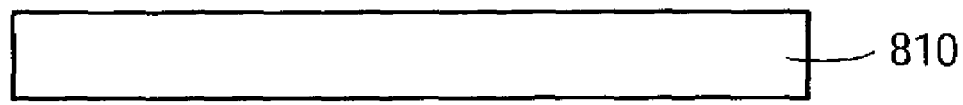
FIGS. 8A through 8I show a cross section of elements of a detector during fabrication, according to one embodiment of the invention.
Figure 8B:
Figure 8C:
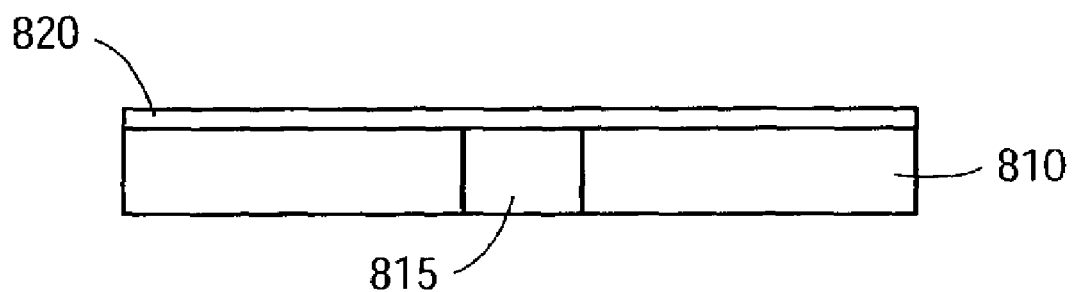
Figure 8D:
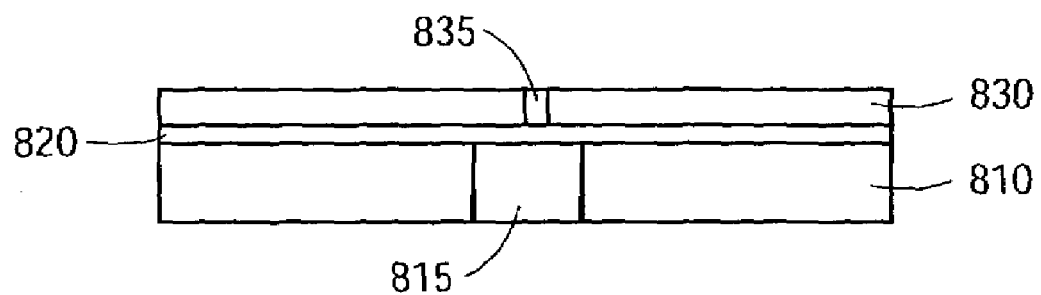
Figure 8E:
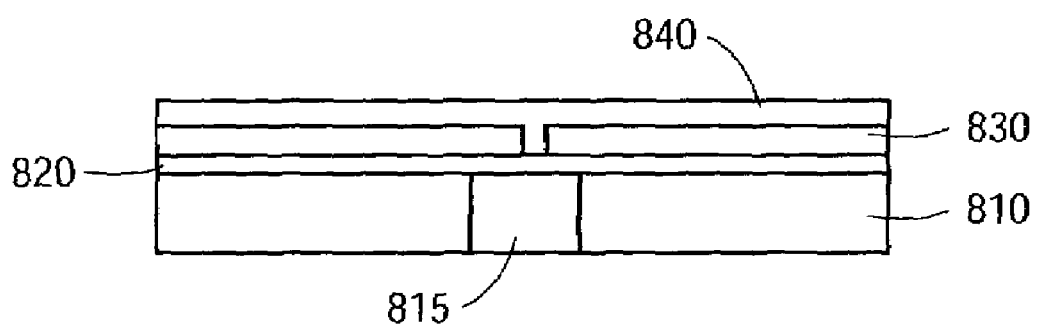
Figure 8F:
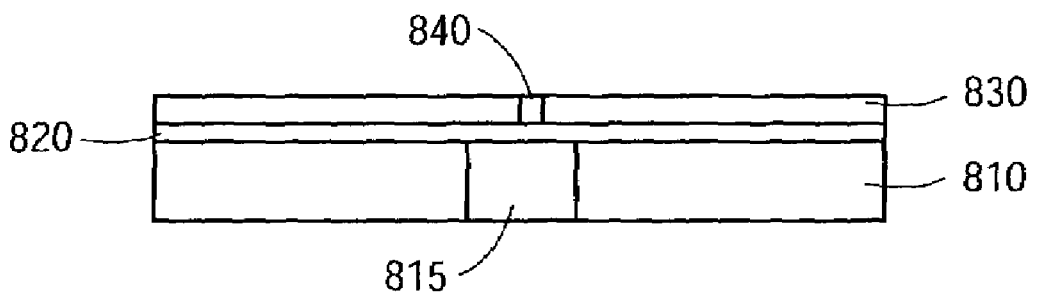
Figure 8G:
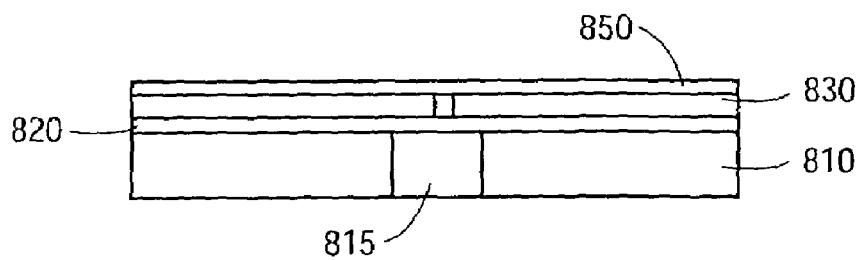
Figure 8H:
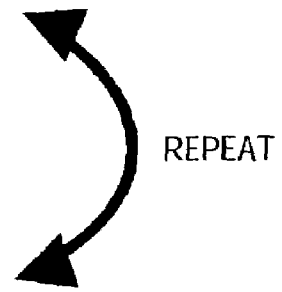
Figure 8H:
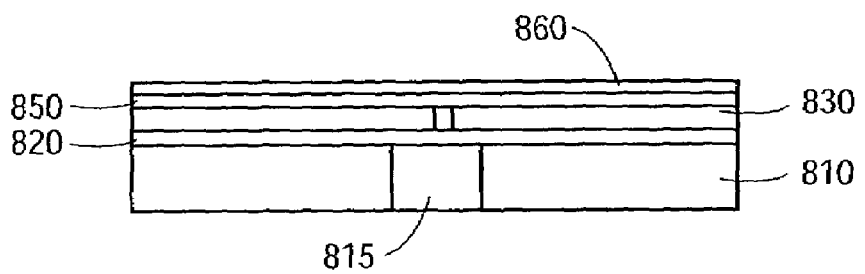
Figure 8I:
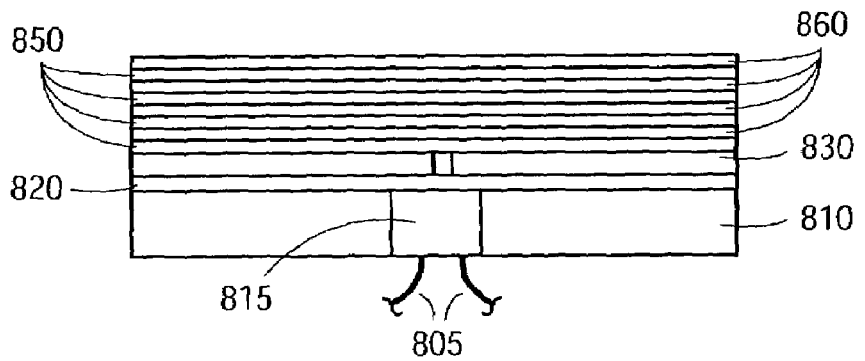

FIG. 7 shows a flow chart of a method of fabricating a detector, according to one embodiment of the invention. FIGS. 8A through 8I show a cross section of elements of a detector during fabrication, according to one embodiment of the invention. The following description discusses elements of FIG. 7 (labeled 7xx) and elements of FIG. 8A through 8I (labeled 8xx) together. However, it is understood that the embodiment of FIG. 7 and the embodiment of FIGS. 8A through 8I may also be practiced separately.

The process may begin with a substrate 810. At 710 a hole is created in the substrate and a sensor 815 is mounted in the hole. The hole may be created by various techniques, such as machining, laser drilling, etc. Various types of sensors may be used, such as diode sensors, pyroelectric sensors, etc. Alternately, a sensor may be fabricated on the substrate as a part of the fabrication process. At 720 an insulating layer 820 is placed on the substrate 810. The insulating layer 820 may be comprised of various materials (e.g., silicon dioxide, silicon nitride, etc.) In one embodiment, chemical vapor deposition (CVD) is used to create the insulating layer, but other techniques may also be used (e.g., sputtering, thermally growing an insulating layer, etc.).

At 725 a control layer 830 is deposited on the insulating layer 820. The control layer may be comprised of material that prevents transmission of radiation to the sensor. One embodiment uses chromium for the control layer 830, but other embodiments may use other materials. Various techniques may be used to deposit the control layer 830, e.g., physical vapor deposition (PVD), sputtering, etc. At 730 a control hole 835 is created in the control layer. The control hole 835 may be sized to control the percentage of radiation striking the control layer that is passed through to the insulating layer 820 and ultimately to the sensor 815. In one embodiment the control hole is formed through lithographic patterning, but other embodiments may use other techniques (e.g., laser micromachining, e-beam writer, etc.). Although a single control hole 835 is shown, other embodiments may have multiple control holes above the sensor.

At 735 the control hole 835 is filled with a filler material 840. One embodiment uses Zirconium as a filler material, but other embodiments may use other materials. In the illustrated embodiment, the filler material 840 is deposited on the control layer 830 through any of various techniques (e.g., sputtering), filling the control hole 835 and coating the surface of the control layer 830, and the excess filler material 840 is then removed at 740 so that the filler material 840 remains only in the control hole 835. At 740 the surface is planarized to create a smooth, planar surface upon which the remaining layers may be placed. In one embodiment, CMP is used to both remove the excess filler material 840 and to planarize the surface. Other techniques may also be used, for example magneto-rheological polishing, ion milling, etc.

A multi-layer reflector may then be fabricated by depositing alternating layers of a first reflective material 850 (as indicated at 745) and a second reflective material 860 (as indicated at 750). At 755 this process is repeated as many times as necessary to get the required number of alternating layers in the multi-layer reflector. The materials may be chosen with different refractive indices at the chosen wavelength, so that the interface between each pair of adjacent layers will reflect a first known portion of incident light and allow a second known portion of the incident light to pass through into the next layer. In one embodiment the two materials 850, 860 are molybdenum and silicon, but other embodiments may use other pairs of materials (e.g., Mo and Be, etc.). In one embodiment the two materials 850, 860 are deposited using magnatron sputtering, but other embodiments may use other techniques (e.g., ion beam coater, etc.).

In one embodiment the final layer is planarized at 760 to provide a smooth planar surface for the multi-layer reflector, but other embodiments may skip this operation. At 765 electrical connections 805 are made to the sensor 815 so that the final detector may be placed into service.

Figure 9:
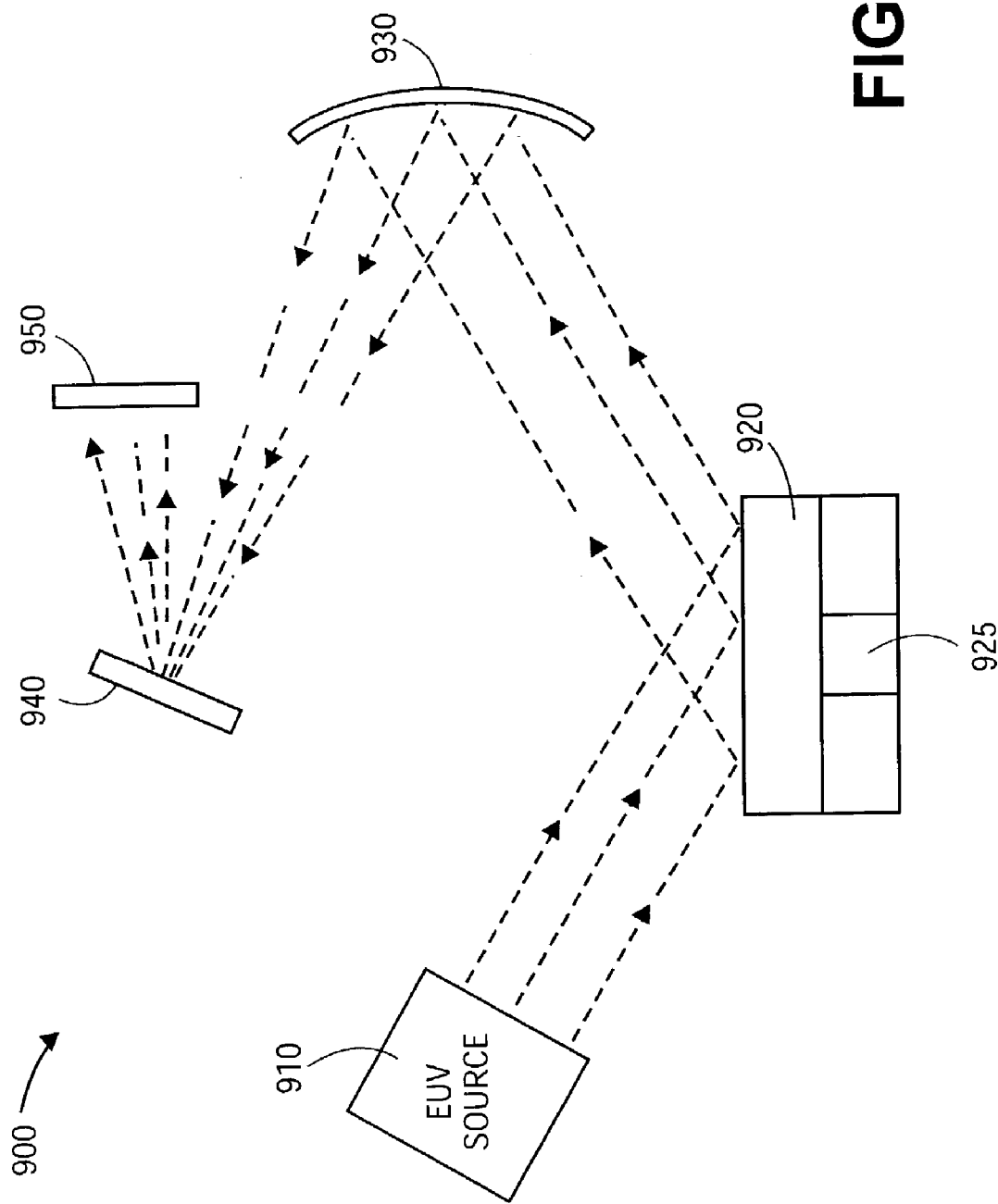
FIG. 9 shows portions of an EUV lithography system, according to one embodiment of the invention.

FIG. 9 shows portions of an EUV lithography system, according to one embodiment of the invention. System 900 may include a source 910 of EUV radiation, a reflective apparatus 920 coupled to a sensor 925, a focusing reflector 930, a mask 940, and a target device 950. In the illustrated system, the source 910 provides EUV radiation traveling in a parallel beam and striking reflective apparatus 920 at an angle. The angles shown in FIG. 9 are for clarity of illustration and may not be the angles used in an actual system.

In one embodiment reflective apparatus 920 comprises a layer of material (e.g., ruthenium, gold, etc.) that reflects a major portion of the incident EUV radiation to focusing reflector 930, while absorbing a smaller portion of the incident EUV radiation and converting the absorbed EUV radiation to thermal energy that may be detected by sensor 925, thus permitting the strength of the incident EUV radiation to be measured. In a particular embodiment the angle of incidence between the EUV radiation and the layer of material is less than approximately 20 degrees, but other embodiments may have other angles.

In another embodiment reflective apparatus 920 comprises a multi-layer reflector that reflects a major portion of the incident EUV radiation to focusing reflector 930, while permitting a smaller portion of the incident EUV radiation to pass through to sensor 925, thus permitting the strength of the incident EUV radiation to be measured. In a particular embodiment the angle of incidence between the EUV radiation and the multi-layer reflector is greater than approximately 45 degrees, but other embodiments may have other angles Focusing reflector 930 may be used to reflect and focus the EUV radiation received from reflective apparatus 920 in a path that will take the EUV radiation to a target area. The focusing reflector 930 may have a curved and very smooth surface so as to focus the EUV radiation accurately at the surface of target 950. In one embodiment target 950 is a wafer being fabricated to create integrated circuits. Reflective mask 940 may be used to create the pattern being focused on the target 950. In one embodiment the reflective mask 940 comprises a pattern of material that is essentially non-reflective to EUV radiation, disposed on the surface of a material that is essentially reflective to EUV radiation. In another embodiment a reflective material may be disposed on a non-reflective surface. In either embodiment the pattern of material on the mask 940 determines the pattern of radiation that reaches the target 950. In some embodiments the pattern of EUV radiation that reaches the target 950 is a reduced-size version of the pattern on mask 940.

Although the illustrated embodiment shows the elements of system 900 in a particular order, other embodiments may have the elements arranged in a different order (e.g., focusing reflector 930 might be disposed in the optical path between source 910 and reflector 920, focusing reflector 930 might be disposed in the optical path between mask 940 and target 950, etc.)

The foregoing description is intended to be illustrative and not limiting. Variations will occur to those of skill in the art. Those variations are intended to be included in the various embodiments of the invention, which are limited only by the spirit and scope of the appended claims.

What is claimed is:

1. A method, comprising:
applying a layer of a material on a pyroelectric sensor, the material having reflective characteristics to reflect a substantial portion of extreme ultraviolet radiation striking the material at an incident angle of less than 20 degrees; and
planarizing a surface of the layer.

2. The method of claim 1, wherein:
said applying a layer of material comprises applying a layer of ruthenium.

3. The method of claim 1, wherein:
said applying a layer of material comprises applying a layer of gold.

4. An apparatus comprising:
a multi-layer reflector comprising a surface to receive and reflect incident extreme ultraviolet radiation;
a pyroelectric sensor coupled to the multi-layer reflector to detect a portion of the extreme ultraviolet radiation passing through the multi-layer reflector; and
a control layer disposed between the multi-layer reflector and the sensor, the control layer comprising a hole through which the portion of the extreme ultraviolet radiation passes from the multi-layer reflector to the sensor.

5. The apparatus of claim 4, wherein:
the control layer comprises chromium.

6. The apparatus of claim 4, wherein:
the hole contains a filler material to filter out a portion of radiation not in an extreme ultraviolet radiation bandwidth.

7. The apparatus of claim 6, wherein:
the filler material comprises zirconium.

8. The apparatus of claim 4, wherein:
the multi-layer reflector comprises alternating layers of a first material and a second material.

9. The apparatus of claim 8, wherein the first material comprises molybdenum.

10. The apparatus of claim 8, wherein the second material comprises silicon.

11. A method comprising:
applying a single layer of material on a sensor, the single layer of material having a reflective characteristic to reflect a substantial portion of extreme ultraviolet radiation striking the single layer of material at an incident angle of less than 20°; and
planarizing a surface of the single layer material.

12. The method of claim 11 wherein said applying said single layer of material comprises applying a single layer of ruthenium.

13. The method of claim 11 wherein said applying said single layer of material comprises applying a single layer of gold.

* * * * *